(12) United States Patent　(10) Patent No.: US 6,940,704 B2
Stalions　(45) Date of Patent: Sep. 6, 2005

(54) SEMICONDUCTOR LIGHT EMITTING DEVICE

(75) Inventor: Drake Charles Stalions, South Lyon, MI (US)

(73) Assignee: GELcore, LLC, Valley View, OH (US)

( * ) Notice: Subject to any disclaimer, the term of this patent is extended or adjusted under 35 U.S.C. 154(b) by 283 days.

(21) Appl. No.: 09/767,695

(22) Filed: Jan. 24, 2001

(65) Prior Publication Data

US 2002/0097579 A1 Jul. 25, 2002

(51) Int. Cl.$^7$ .......................... H01L 29/267; F21V 7/00
(52) U.S. Cl. .......................... 361/241; 362/311; 257/81
(58) Field of Search ................................ 362/241, 247, 362/249, 800, 311; 257/81, 82, 94, 95, 99, 103

(56) References Cited

U.S. PATENT DOCUMENTS

| | | | |
|---|---|---|---|
| 3,805,347 A | | 4/1974 | Collins et al. |
| 4,267,559 A | | 5/1981 | Johnson et al. |
| 4,316,208 A | * | 2/1982 | Kobayashi et al. ........... 257/98 |
| 4,387,385 A | | 6/1983 | Thillays et al. |
| 4,843,280 A | | 6/1989 | Lumbard et al. |
| 5,040,868 A | | 8/1991 | Waitl et al. |

(Continued)

FOREIGN PATENT DOCUMENTS

| | | |
|---|---|---|
| EP | 0047591 | 8/1981 |
| EP | 0374121 | 10/1989 |
| JP | 54-6787 | 1/1979 |
| JP | 56-69879 | 6/1981 |
| JP | 61-147587 | 7/1986 |
| JP | 1-204480 | 8/1989 |
| JP | 1-266771 | 10/1989 |

Primary Examiner—Sandra O'Shea
Assistant Examiner—Guiyoung Lee
(74) Attorney, Agent, or Firm—Fay, Sharpe, Fagan, Minnich & McKee, LLP

(57) ABSTRACT

A light emitting diode (LED) including a combination of features that enable the LED to produce a high-brightness predetermined radiation pattern. The combination of features enable the LED to function cooler and more reliably at a higher drive currents and elevated ambient temperatures, and therefore emit light of increased brightness, without overheating, and to have a particular radiation pattern. In particular, a surface mount that is capable of operating at high drive currents and high ambient temperatures is disclosed. The LED comprises a surface mount package having a metal lead frame having mass sufficient to provide low thermal resistance, at least one anode contact pad and at least one cathode contact pad. The LED also includes a reflector positioned within the package, a semiconductor die and an optional focusing dome. The semiconductor die comprises a transparent substrate and a semiconductor component and is positioned within the package so that the semiconductor component and the substrate are arranged side-by-side over the reflector (flop-chip). Alternatively, the die is positioned within the package so that the substrate is on top of the semiconductor component (flip-chip). The optional focusing dome is operative to refract light emitted from the semiconductor die and light reflected from the reflector to create a predetermined radiation pattern.

12 Claims, 4 Drawing Sheets

U.S. PATENT DOCUMENTS

| | | |
|---|---|---|
| 5,055,892 A | 10/1991 | Gardner et al. |
| 5,187,547 A | 2/1993 | Niina et al. |
| 5,233,204 A | 8/1993 | Fletcher et al. |
| 5,266,817 A | 11/1993 | Lin |
| 5,298,768 A | 3/1994 | Okazaki et al. |
| 5,506,445 A | 4/1996 | Rosenberg |
| 5,534,718 A | 7/1996 | Chang |
| 5,705,834 A | 1/1998 | Egalon et al. |
| 5,760,422 A | 6/1998 | Ishinaga |
| 5,780,321 A | 7/1998 | Shieh et al. |
| 5,782,555 A | 7/1998 | Hochstein |
| 5,785,418 A | 7/1998 | Hochstein |
| 5,803,579 A | 9/1998 | Turnbull et al. |
| 5,852,517 A | 12/1998 | Gerber et al. |
| 5,898,191 A | 4/1999 | Kwon et al. |
| 5,907,162 A | 5/1999 | Maruyama |
| 5,973,336 A | 10/1999 | Hanke et al. |
| 5,990,498 A | 11/1999 | Chapnik et al. |
| 5,998,810 A | 12/1999 | Hatano et al. |
| 6,015,719 A | 1/2000 | Kish, Jr. et al. |
| RE36,614 E | 3/2000 | Lumbard et al. |
| 6,038,387 A | 3/2000 | Machida |
| 6,274,890 B1 * | 8/2001 | Oshio et al. ................... 257/98 |
| 6,335,548 B1 * | 1/2002 | Roberts et al. ................ 257/98 |
| 6,376,902 B1 * | 4/2002 | Arndt ......................... 257/678 |
| 6,507,049 B1 * | 1/2003 | Yeager et al. ................ 257/100 |

\* cited by examiner

SEMICONDUCTOR LIGHT EMITTING DEVICE

BACKGROUND OF THE INVENTION

This invention relates to a semiconductor light emitting device having increased current capacity and increased brightness. In particular, this invention relates to a light emitting diode (LED) having a configuration that includes a highly thermally conductive surface mount package that enables the use of higher drives currents and thus produces increased brightness.

Light emitting diodes (LEDs) that are currently used have limitations. For example, at relatively low drive currents, the amount of flux an LED produces is directly related to its drive current. For most applications, it is desirable to drive LEDs at as high a current as possible in order to maximize the brightness of their emission. But, at higher drive currents, an LED generates a greater amount of heat. And, as the temperature of the LED die increases, the LED becomes less efficient and thus, its brightness is reduced. As an LED die experiences increasing temperatures during operation, not only can its efficiency be reduced, but it can also create reliability problems within the LED structure. Further, increased die temperature may also lead to a wavelength shift in the LED. The temperature of the environment surrounding the LED will also contribute to the temperature of the LED die and thus, these temperature effects. Therefore, there is a need for this heat to be dissipated.

Generally, the primary means through which an LED dissipates heat is through its package. Of the packaging choices available, through-hole leaded packages and surface mount packages are the most common. Of these two choices, through-hole leaded packages can accommodate large lead frames and therefore generally provide better heat conductivity. But, use of through-hole leaded packages in circuit board assemblies requires the use of a costly and difficult to control wave solder process. Surface mount packaging is often more desirable from a circuit board assembly manufacturing standpoint, because it can be used with a more precise reflow solder process. But, prior to the present invention, surface mount packages have not combined the use of high thermal conductivity lead frame designs for use at high drive currents (that is, applications at which the LED is to be driven at a current in excess of 50 mA), with improved die attach methods for operation in high temperature environments (eliminating the wire bond connection).

The drive current of an LED is also limited by the mounting of the semiconductor die within the package. In a traditional configuration, the die is positioned on its substrate within the package on top of the cathode (or anode). A wire bond is used to establish contact between the die and the anode (or cathode). The die and wire bond are typically over-molded with an epoxy. The wire bond and epoxy, however, are also susceptible to deterioration due to the effects of heat. That is, as the epoxy heats and cools, the epoxy expands, causing stress in the wire. Eventually, the LED may fail due to stress and a break in the wire bond.

Alternatively, if a die is used which emits light from both the top and bottom surfaces (transmissive substrate), the die may be positioned on its side as a "flop-chip" (with substrate and light emitting component arranged side-by-side) or upside down as a "flip-chip" (with substrate on top of light emitting component). In both cases, the die is positioned between the cathode and anode, yet still produces a symmetrical pattern of light. In the "flop-chip" and "flip-chip" configuration, the wire bond is eliminated and solder bridges are used to establish contact between the die and the anode and cathode pads. While these configurations improve the reliability of the anode and cathode to die connections compared to use of a wire bond, they have not heretofore been used in high current (above 50 mA) LED devices.

These and other drawbacks exist with conventional LEDs.

BRIEF SUMMARY OF THE INVENTION

Therefore, a need has arisen for an LED having a combination of features that enable it to generate more light than is possible with standard die, and to operate reliably in higher temperature thermal environments (exceeding 85° C.) and at higher drive currents (exceeding 50 mA) while using reflow solderable LED packages.

According to one embodiment, the invention comprises a surface mount light emitting diode. The LED comprises a surface mount package having a metal lead frame having mass sufficient to provide low thermal resistance, e.g., less than 300 K/W, at least one anode contact pad and at least one cathode contact pad. The LED also includes a reflector positioned within the package beneath a semiconductor die. The semiconductor die comprises a transparent substrate and a semiconductor component. The semiconductor die is positioned within the package so that the semiconductor component and the substrate are arranged side-by-side over the reflector. The focusing dome is operative to refract light emitted from the semiconductor die and light reflected from the reflector to create a predetermined radiation pattern. According to one embodiment, the LED also includes a focusing dome that enables a particular or uniform radiation pattern to be created.

Other features and advantages of the present invention will be apparent to one of ordinary skill in the art upon reviewing the detailed description of the present invention.

DETAILED DESCRIPTION OF THE INVENTION

While the foregoing description includes many details and specifics, it is to be understood that these have been included for purposes of explanation only, and are not to be interpreted as limitations of the present invention. Many modifications to the embodiments described can be made without departing from the spirit and scope of the invention, as is intended to be encompassed by the following claims and their legal equivalents.

The LED of the present invention includes a unique combination of features that enable the LED to produce a high-brightness predetermined radiation pattern. The combination of features enable the LED to function reliably at a higher drive current at a given ambient temperature, and therefore emit light of increased brightness, and to have a particular, e.g., symmetrical, radiation pattern.

Figure 1:
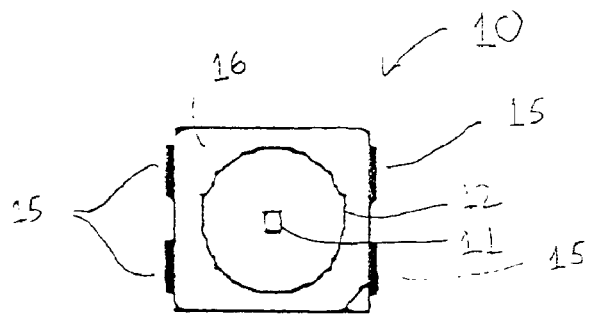
FIG. 1 is a top view of an LED according to one embodiment of the present invention.
Figure 2:
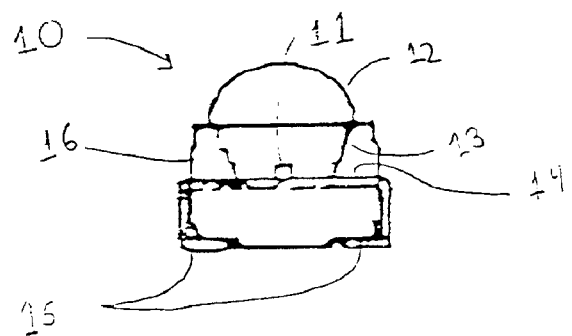
FIG. 2 is a cross-sectional view of an LED according to one embodiment of the present invention.

An LED according to one embodiment of the present invention will now be explained in conjunction with FIGS. 1–9. FIGS. 1 and 2 depict top and cross-sectional views of an LED 10 according to one embodiment of the present invention. The LED 10 shown in FIGS. 1 and 2 includes semiconductor chip 11, focusing dome 12, reflector 13, lead frame 14, contact pads 15 and packaging 16. Each of these components will be explained in more detail below.

Figure 4:
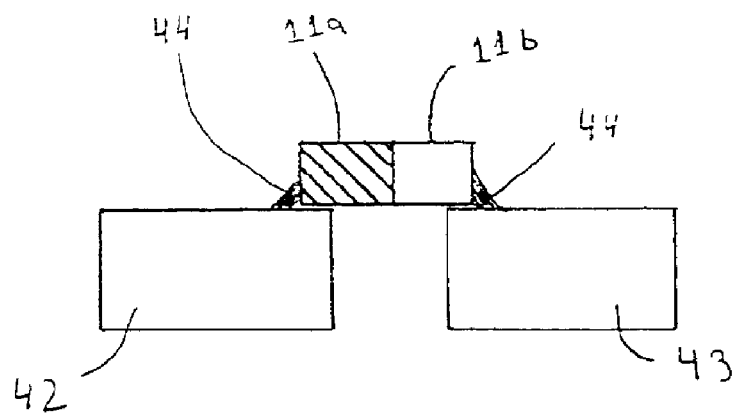
FIG. 4 is a side view of an LED having a "flop-chip" configuration according to one embodiment of the present invention.
Figure 5:
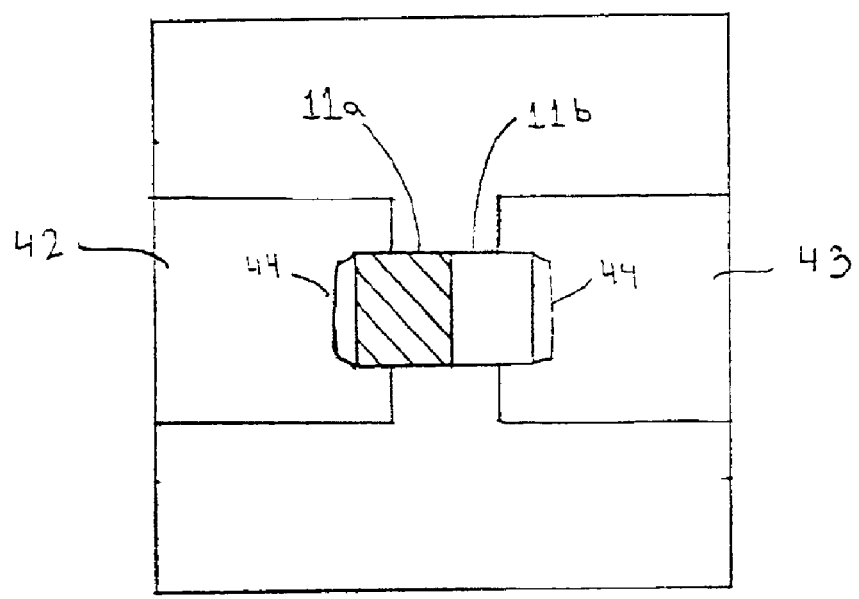
FIG. 5 is a top view of an LED having a "flop-chip" configuration according to one embodiment of the present invention.

FIGS. 4 and 5 show more detailed side and top views, respectively, of an LED according to one embodiment of the present invention. FIG. 4 shows semiconductor chip 11, cathode contact 42, anode contact 43, and solder bridges 44. FIG. 4 also specifically shows substrate 11a and light-emitting component 11b of semiconductor chip 11. As can be seen from FIG. 4, semiconductor chip 11 is oriented in a flop-chip configuration with the semiconductor component 11b and substrate 11a in side-by-side relation to each other. According to an alternative embodiment, semiconductor chip 11 is oriented in a flip-chip configuration.

According to one embodiment, substrate 11a comprises a transmissive substrate that enables light emitted from light-emitting component 11b to pass through so that the radiation pattern of the LED 10 is not effected. The use of a transmissive substrate, along with reflector 13 can improve the light output of the device by 100% or more. According to one embodiment, the transmissive material chosen for the substrate depends on the material being used for light-emitting component 11b. For example, light-emitting component 11b comprises an AlInGaP compound and transmissive substrate 11a comprises GaP. In this example, LED 10 comprises a flop-chip configuration. As explained above, in a flop-chip configuration, the chip is flopped on its side so that substrate 11a and light-emitting component 11b are arranged side-by-side.

According to another example, light-emitting component 11b comprises a GaN-based compound and transmissive substrate 11a comprises sapphire. According to this example, LED 10 comprises a flip-chip configuration. As explained above, in a flip-chip configuration, the chip is completely flipped over so that substrate 11a is on top of light emitting component 11b relative to the way in which the chip is mounted. In the flip-chip configuration, the anode and cathode connections are established directly to light emitting component 11b and thus, the wire bonds are still eliminated. The flip-chip configuration and flop-chip configuration may be interchanged depending on the application and the materials used.

Figure 6:
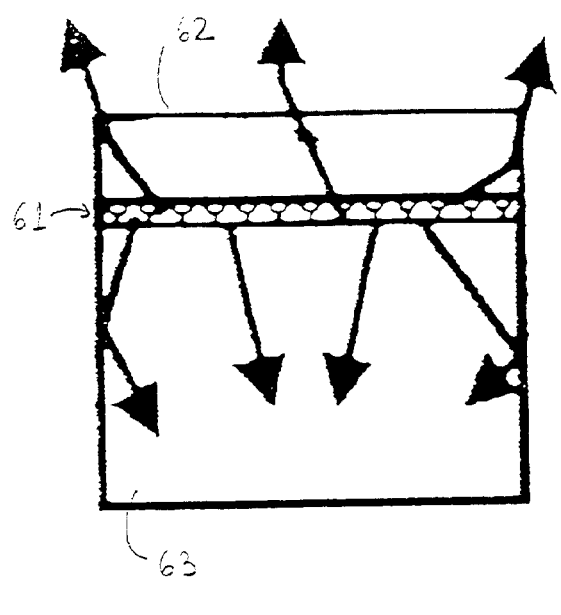
FIG. 6 is a schematic diagram showing operation of an LED having an absorbing substrate.

As explained in the background, conventional LEDs include surface mount packages utilizing die with absorbing substrates. FIG. 6 schematically depicts the operation of an LED having an absorbing substrate. The LED of FIG. 6 includes an active layer that emits light 61, an epilayer window 62 and an absorbing substrate 63. As can be seen in FIG. 6, a substantial portion of the light emitted by active layer 61 is emitted away from the object of the emission (through window 62). This light is internally reflected within absorbing substrate 63 and dissipated. This leads to relatively inefficient operation of the LED, and prevents a symmetrical radiation pattern when used with a flop-chip mounting method.

Figure 7:
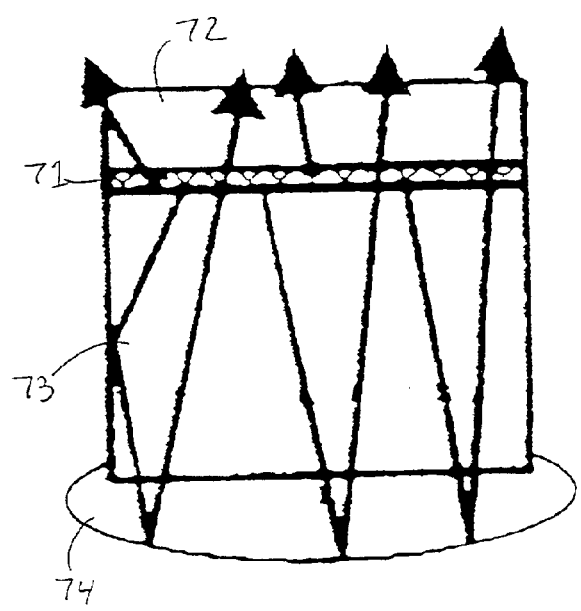
FIG. 7 is a schematic diagram showing operation of an LED having a transmissive substrate according to one embodiment of the present invention.

In contrast, FIG. 7 schematically depicts an LED having a transmissive substrate and reflector. The LED of FIG. 7 includes an active layer that emits light 71, an epilayer window 72, a transmissive substrate 73 and a reflector 74 according to the teachings of the present invention. As can be seen in FIG. 7, a substantial portion of the light from active layer 71 is still emitted away from the object of the emission. With transmissive substrate 73, however, this light is incident upon reflector 74 and reflected back up through the LED out window 72 and toward the object. Transmissive substrate 73, however, is not a perfect conductor. A portion of the light is still lost, for example, to internal reflection within substrate 73. But, the efficiency of an LED having a transmissive substrate, as shown in FIG. 7, is substantially better than that of an LED having an absorbing substrate as shown in FIG. 6.

Light-emitting component 11b comprises any commercially available light-emitting semiconductor that may utilize a transmissive substrate. According to one embodiment, light-emitting component 11b comprises an AlInGaP compound and is accompanied by a GaP transmissive substrate. According to this embodiment, LED 10 comprises a flop-chip configuration. According to another embodiment, light-emitting component 11b comprises a GaN-based compound and is accompanied by a sapphire substrate. According to this embodiment, LED 10 comprises a flip-chip configuration as explained above. Other light-emitting components are possible and within the scope of the invention.

FIGS. 4 and 5 also show cathode contact 42, anode contact 43 and solder bridges 44. Cathode contact 42 and anode contact 43 operate to establish contact between semiconductor chip 11 and lead frame 14. According to one embodiment, cathode contact 42 and anode contact 43 comprise a portion of the electrically and thermally conductive lead frame 14. According to one particular embodiment, cathode contact 42 and anode contact 43 comprise copper or silver-plated copper.

Solder bridges 44 take the place of wire bonds in establishing contact between semiconductor chip 11, cathode contact 42 and anode contact 43. According to one particular embodiment, solder bridges 44 comprise beads of thermally and electrically conductive solder material that each have a relatively triangular cross section as shown in FIG. 4.

LEDs are generally created for a particular environment with a particular lighting need. For example, one common application for LEDs is for backlighting warning indicator icons, for example, on an automobile instrument panel. In such an application, if the back lit surface is relatively close to the LED, the LED advantageously has a wide radiation pattern, designed to provide a relatively uniform light along the back of the instrument display warning indicator. In another application, the LED may need to backlight a surface which is relatively far away from the LED, or even be designed to provide a point signal, such as, an "on" indicator light. In these types of applications, the LED is designed to provide maximum brightness over a narrow viewing angle. Therefore, LED 10 may also include a focusing dome 12 that provides a particular radiation pattern depending on the application for which the LED is to be used. According to one embodiment, focusing dome 12 comprises an extension of the epoxy containing the die which is shaped into a lens that is designed to create a particular radiation pattern. According to one embodiment, the thickness and shape of focusing dome 12 are adjusted to form the desired radiation pattern taking into account the index of refraction of the material used for focusing dome 12 and semiconductor chip 11. According to one embodiment, focusing dome 12 comprises any commercially available LED epoxy material with the choice of a particular epoxy depending on the formation of the LED.

LED 10 also includes reflector 13. Reflector 13 is used in conjunction with focusing dome 12 to create the desired radiation pattern. According to one embodiment, reflector 13 comprises a reflector cup formed out of the base of the LED package material. According to a particular embodiment, reflector 13 is transfer molded into the package material. According to other embodiments, reflector 13 may be incorporated into leadframe 14. The shape of reflector 13 according to one embodiment, can be seen in FIG. 2. According to this embodiment, reflector 13 has the shape of a truncated cone. Nevertheless, the shape of the reflector is preferably designed to produce a desired radiation pattern. According to one embodiment, reflector 13 is designed to produce a 120 degree radiation pattern. According to other embodiments, narrower radiation patterns are possible. According to one particular embodiment, focusing dome 12 may be used in conjunction with reflector 13 to produce a narrower radiation pattern.

LED 10 also includes lead frame 14. Lead frame 14 is used to establish contact between the cathode contact 42 and anode contact 43 and the circuit within which LED 10 will be used. According to one embodiment, cathode contact 42 and anode contact 43 are part of lead frame 14. According to the embodiment shown in FIG. 2, lead frame 14 comprises pads 15 for mounting to the surface of a circuit board using, for example, a re-flow technique. According to one particular embodiment, lead frame 14 comprises a frame of metal having a thermal conductivity sufficient to enable LED 10 to be driven at a current of greater than 50 mA while providing adequate heat dissipation to allow the device to operate reliably above 85° C. ambient temperatures. According to one embodiment, lead frame comprises a frame of copper or silver-plated copper. Other materials are possible.

Figure 8:
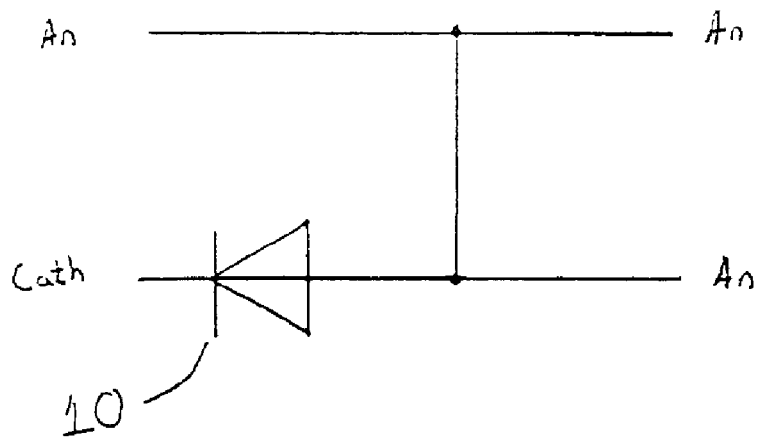
FIG. 8 is a schematic diagram of an LED according to one embodiment of the present invention.
Figure 9:
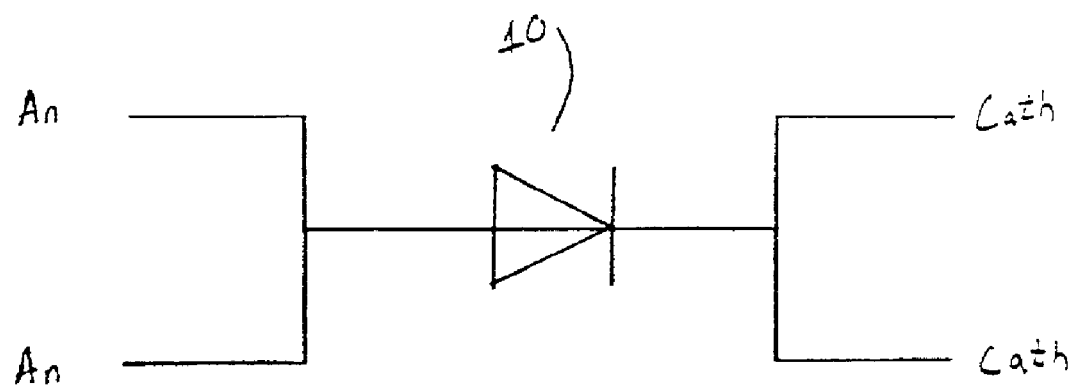
FIG. 9 is a schematic diagram of an LED according to one embodiment of the present invention.

Lead frame 14 shown in FIGS. 1 and 2 comprises four contact pads 15. In other embodiments, LED 10 and lead frame 14 could be designed to have any number of contact pads 15 depending on the environment in which LED 10 is to be used. Contact pads 15 serve the dual purpose of establishing electrical contact between the circuit board and LED 10 and providing a heat conduction path to dissipate heat from LED 10. Contact pads 15 can be either anode or cathode contacts. Thus, contact pads 15 of LED 10 are designed to maximize the usefulness of LED 10 for its given application and to maximize its ability to dissipate heat. FIGS. 8 and 9 show equivalent circuits for two embodiments of LED 10. According to the embodiment shown in FIG. 8, LED 10 comprises three anode contacts 15 and one cathode contact 15. This embodiment is advantageous because, typically, more heat is generated at the anode side of an LED than at the cathode side. According to another embodiment shown in FIG. 9, LED 10 comprises two anode contacts and two cathode contacts. In both FIGS. 8 and 9, the diodes indicate the direction of current flow for the LED. Although FIGS. 8 and 9 show two particular arrangements of anodes and cathodes, one of ordinary skill in the art would understand that the anodes and cathodes can be arranged differently for different applications.

LED 10 also comprises packaging 16. Packaging 16 provides protection to the various connections that have been established within LED 10, such as, between semiconductor chip 11 and lead frame 14. Packaging 16 also provides a decorative and functional vehicle so that LED 10 can be used in a visible location and not be unsightly. According to one embodiment, packaging 16 comprises a plastic material that is heat resistant.

Figure 3:
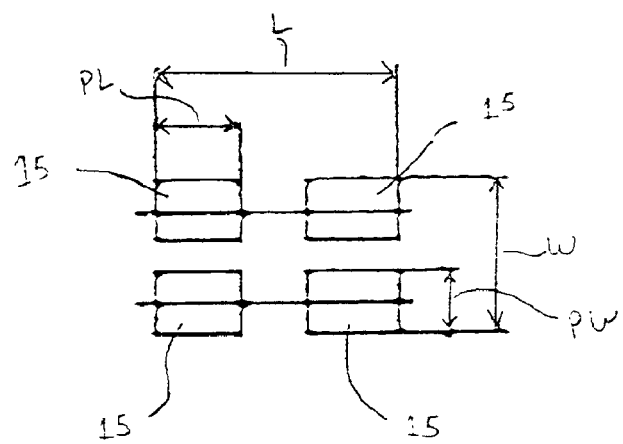
FIG. 3 is a bottom view of an LED according to one embodiment of the present invention.

Lead frame 14 and packaging 16 are also designed according to the particular environment in which LED 10 will be used. FIG. 3 depicts the dimensions of the footprint of LED 10. According to one embodiment, LED 10 is designed so that an overall length (L), an overall width (W), a pad length (PL) and a pad width (PW) are of the appropriate size given the environment within which LED 10 is to be used. According to a particular embodiment, lead frame 14 and packaging 16 are designed so that existing placement equipment and existing circuit board layouts may be used. According to another embodiment, lead frame 14 and packaging 16 are designed to maximize the ability of LED 10 to dissipate heat. According to one preferred embodiment, L, W, PL and PW are designed taking into account all of the above recited considerations.

Other embodiments and uses of the invention will be apparent to those skilled in the art from consideration of the specification and practice of the invention disclosed herein.

What is claimed is:

1. A light emitting diode comprising:
   a first metal lead having mass sufficient to provide low thermal resistance including at least one anode contact pad and at least one anode contact for electrical connection to a circuit board;
   a second metal lead having mass sufficient to provide low thermal resistance including at least one cathode contact pad and at least one cathode contact for electrical connection to said circuit board;
   said cathode contact pad and said cathode contact comprised of a contiguous metal lead and said anode contact pad and said anode contact comprised of a contiguous metal lead;
   a reflector;
   a semiconductor die, comprising a transparent substrate and a light emitting component, wherein the semiconductor die connects to the metal lead frame via at least two solder bridges positioned between said anode contact pad and said cathode contact pad over the reflector; and,
   said electrical connection of said circuit board to said semiconductor die being free of wire bond attachment.

2. The light emitting diode of claim 1 further comprising a focusing dome operative to refract light emitted from the semiconductor die and light reflected from the reflector to create a predetermined radiation pattern.

3. The light emitting diode of claim 2 wherein the radiation pattern comprises a 120 degree illumination pattern.

4. The light emitting diode of claim 1 wherein the reflector comprises a truncated cone shape.

5. The light emitting diode of claim 1 wherein the lead frame comprises a lead frame having a thermal resistance less than 300 K°/W.

6. The light emitting diode of claim 1 wherein the lead frame comprises copper.

7. The light emitting diode of claim 1 wherein the lead frame comprises silver-plated copper.

8. The light emitting diode of claim 1 wherein the light emitting component comprises a GaN based compound semiconductor and the substrate comprises sapphire.

9. The light emitting diode of claim 1 wherein the light emitting component comprises an AlInGaP compound semiconductor and the substrate comprises GaP.

10. The light emitting diode of claim 1 wherein the substrate is positioned on top of the light emitting component over the reflector.

11. The light emitting diode of claim 1 wherein the metal lead frame comprises three anode contact pads and one cathode contact pad.

12. A light emitting diode comprising:

a first metal lead having mass sufficient to provide low thermal resistance including at least one anode contact pad and at least one anode contact for electrical connection to a circuit board;

a second metal lead having mass sufficient to provide low thermal resistance including at least one cathode contact pad and at least one cathode contact for electrical connection to said circuit board;

said cathode contact pad and said cathode contact being comprised of a contiguous metal lead and said anode contact pad and said anode being comprised of a contiguous metal lead;

a semiconductor die comprising a transparent substrate and a light emitting region, wherein the transparent substrate connects to the metal lead frame via a solder bridge between one of said anode contact pad and said cathode contact pad, and said light emitting region connects to the metal lead frame via a solder bridge between the other of said anode contact pad and said cathode contact pad; and, said electrical connection of said circuit board to said semiconductor die being free of wire bond attachment.

* * * * *